(12) United States Patent
Kim et al.

(10) Patent No.: US 8,089,812 B2
(45) Date of Patent: Jan. 3, 2012

(54) SEMICONDUCTOR MEMORY DEVICE

(75) Inventors: Dong-Keun Kim, Kyoungki-do (KR);
Jee-Eun Lee, Kyoungki-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 976 days.

(21) Appl. No.: 11/967,536

(22) Filed: Dec. 31, 2007

(65) Prior Publication Data

US 2010/0284233 A1   Nov. 11, 2010

(30) Foreign Application Priority Data

Apr. 17, 2007  (KR) ......................... 10-2007-0037455

(51) Int. Cl.
*G11C 11/34* (2006.01)
(52) U.S. Cl. ............. 365/185.2; 365/210.1; 365/185.09; 365/225.7
(58) Field of Classification Search ................ 365/185.2, 365/210.1, 185.09, 225.7
See application file for complete search history.

(56) References Cited

U.S. PATENT DOCUMENTS 5,999,463 A  * 12/1999 Park et al. ..................... 365/200
6,937,532 B2    8/2005 Hatanaka et al.

FOREIGN PATENT DOCUMENTS

| CN | 1248236 C | 3/2006 |
|---|---|---|
| JP | 09-167499 | 6/1997 |
| KR | 1020010057382 | 7/2001 |
| KR | 1020020041549 A | 6/2002 |

OTHER PUBLICATIONS

Notice of Preliminary Rejection issued from Korean Intellectual property Office on Dec. 23, 2008 with an English translation.
Notice of Preliminary Rejection issued from State Intellectual Property Office of China on May 27, 2010 with an English Translation.
Notice of Allowance issued from Korean Intellectual Property Office on May 25, 2009 with an English Translation.
Notice of Preliminary Rejection issued from Korean Intellectual Property Office on May 28, 2008 with an English translation.
Preliminary Rejection issued from Taiwanese Intellectual Property Office on Jul. 25, 2011.

* cited by examiner

*Primary Examiner* — Jason Lappas
(74) *Attorney, Agent, or Firm* — IP & T Group LLP

(57) ABSTRACT

A semiconductor memory device can reduce a circuit area necessary for row repair. The semiconductor memory device includes a plurality of memory banks, a plurality of cell arrays arranged in each of the memory banks, a plurality of array word lines arranged in each of the cell arrays, one or more repair word lines arranged in each of the cell arrays, and a plurality of repair information storages configured to store bank information and row addresses of the array word lines to be replaced with the repair word lines.

9 Claims, 6 Drawing Sheets

SEMICONDUCTOR MEMORY DEVICE

CROSS-REFERENCE TO RELATED APPLICATIONS

The present invention claims priority to Korean patent application number 10-2007-0037455, filed on Apr. 17, 2007, which is incorporated by reference in its entirety.

BACKGROUND OF THE INVENTION

The present invention relates to a semiconductor memory device, and more particularly, to an apparatus for repairing a defect of a semiconductor memory device.

In a semiconductor memory device, defective memory cells can be repaired using X-addresses and Y-addresses. A repairing apparatus using the X-addresses will be described below.

FIG. 1 is a block diagram of a conventional semiconductor memory device.

Referring to FIG. 1, the conventional semiconductor memory device includes a plurality of banks 100, 110, 120 and 130, each having plural respective cell arrays 102, 112, 122 and 132 and repair information storages 104, 114, 124 and 134.

FIG. 2 is a block diagram of bank 110 illustrated in FIG. 1.

Referring to FIG. 2, bank 110 includes a plurality of cell arrays 112', 112'', etc., a plurality of repair information storages 114', 114'', etc., XHIT blocks 111', 111'', etc., HITB_SUM blocks 119', etc., a plurality of bit line sense amplifier arrays 113', 113'', 113''', etc. and bit line sense amplifier controllers 115', 115'', 115''', etc. and a plurality of row control circuits.

Each of the cell arrays 112', 112'', etc. includes a main word line MWL, a repair main word line RMWL, connected to an MWL driver 116', 116'', etc. and an RMWL driver 118', 118'', etc. respectively, which are driven by a block control block 117', 117'', etc. When a signal BAX<0:M> containing active information and X-address information and a signal BS containing block selection information are applied to the block control block 117', 117'', etc., the main word line MWL or the repair main word line RMWL are driven according to determination information XHIT and NXE outputted from a repair information storage 114', 114'', etc.

In other words, the repair information storage stores information about which main word line is defective. When the semiconductor memory device accesses the defective main word line, the repair information storage outputs a signal for allowing the semiconductor memory device to access a repair main word line RMWL, instead of the defective main word line MWL.

FIG. 3 is a block diagram of the repair information storage illustrated in FIGS. 1 and 2.

Referring to FIG. 3, the repair information storage includes a first storage unit 310, a second storage unit 320, and an output unit 330. The first storage unit 310 stores information about whether the repair information storage is used or not, and the second storage unit 320 stores an X-address of a main word line MWL to be repaired. The output unit 330 outputs a signal HITB for driving the repair main word line RMWL when an inputted address ADDRESS<0:N> is identical to the information stored in the second storage unit 320.

The first storage unit 310 and the second storage unit 320 store information about the defects of the semiconductor memory device, and include a plurality of fuses for storing repair information.

The number of repair main word lines RMWL of the cell array is physically identical to the number of repair information storages. That is, when one repair main word line RMWL is provided in each cell array, one repair information storage is provided in each cell array.

In a case where the semiconductor memory device is actually repaired using the repair information storage, if a defective memory cell is found in a specific cell array, a fuse of the first storage unit 310 is cut so as to use the repair information storage. A fuse of the second storage unit 320, which corresponds to an X-address indicating the defective memory cell, is cut. When the fuse of the first storage unit 310 is cut, signals FUSE_PWR and FUSE_EN are activated and transferred to the second storage unit 320. The second storage unit 320 is enabled in response to the signals FUSE_PWR and FUSE_EN. When the inputted address ADDRESS<0:N> is identical to the address stored in the second storage unit 320, that is, when the semiconductor memory device accesses the defective main word line MWL, the second storage unit 320 outputs the signal HIT<0:N> to the output unit 330. The output unit 330 enables the signal HITB to a low level when it receives the active signal ACT and the defect information HIT<0:N>.

The repair information storage of FIG. 3 is, for example, the repair information storage 114'' shown in FIG. 2. Referring again to FIG. 2, the signal HITB 1 is activated to a low level and is inputted to an XHIT block 111'' and an HITB_SUM block 119'. The XHIT block 111'' and the HITB_SUM block 119' activate the signals XHIT 1 and NXE. In response to the signal NXE, the block control block 117'' does not drive the main word lines MWL. In response to the signal XHIT 1, the block control block 117'' drives the repair main word line RMWL1 of the cell array 112''.

In other words, the repair information storage provided in each cell array stores information about the main word line MWL to be repaired. When the semiconductor memory device accesses the defective main word line MWL, the repair information storage outputs the signal HITB for allowing the semiconductor memory device to access the repair main word line RMWL, instead of the defective main word line MWL.

As described above, the conventional semiconductor memory device includes separate repair information storages for each cell array in order to repair rows. However, the repair information storage occupies the largest area among circuits disposed in the row path, resulting in an increase in total area of the semiconductor memory device.

SUMMARY OF THE INVENTION

Embodiments of the invention are directed to providing a semiconductor memory device, which can reduce the circuit area necessary for row repair.

In accordance with an aspect of the invention, there is provided a semiconductor memory device, including a plurality of memory banks, a plurality of cell arrays arranged in each of the memory banks, a plurality of array word lines arranged in each of the cell arrays, one or more repair word lines arranged in each of the cell arrays, and a plurality of repair information storages configured to store bank information and row addresses of word lines to be replaced with the repair word lines.

In accordance with an aspect of the invention, there is provided a semiconductor memory device, including a plurality of banks each having a plurality of unit memory blocks with a plurality of word lines and repair word lines, and a plurality of repair fuse circuits configured to store bank information and a row address of a word line to be repaired.

DESCRIPTION OF SPECIFIC EMBODIMENTS

Hereinafter, a semiconductor memory device in accordance with the invention will be described in detail with reference to the accompanying drawings.

Figure 1:
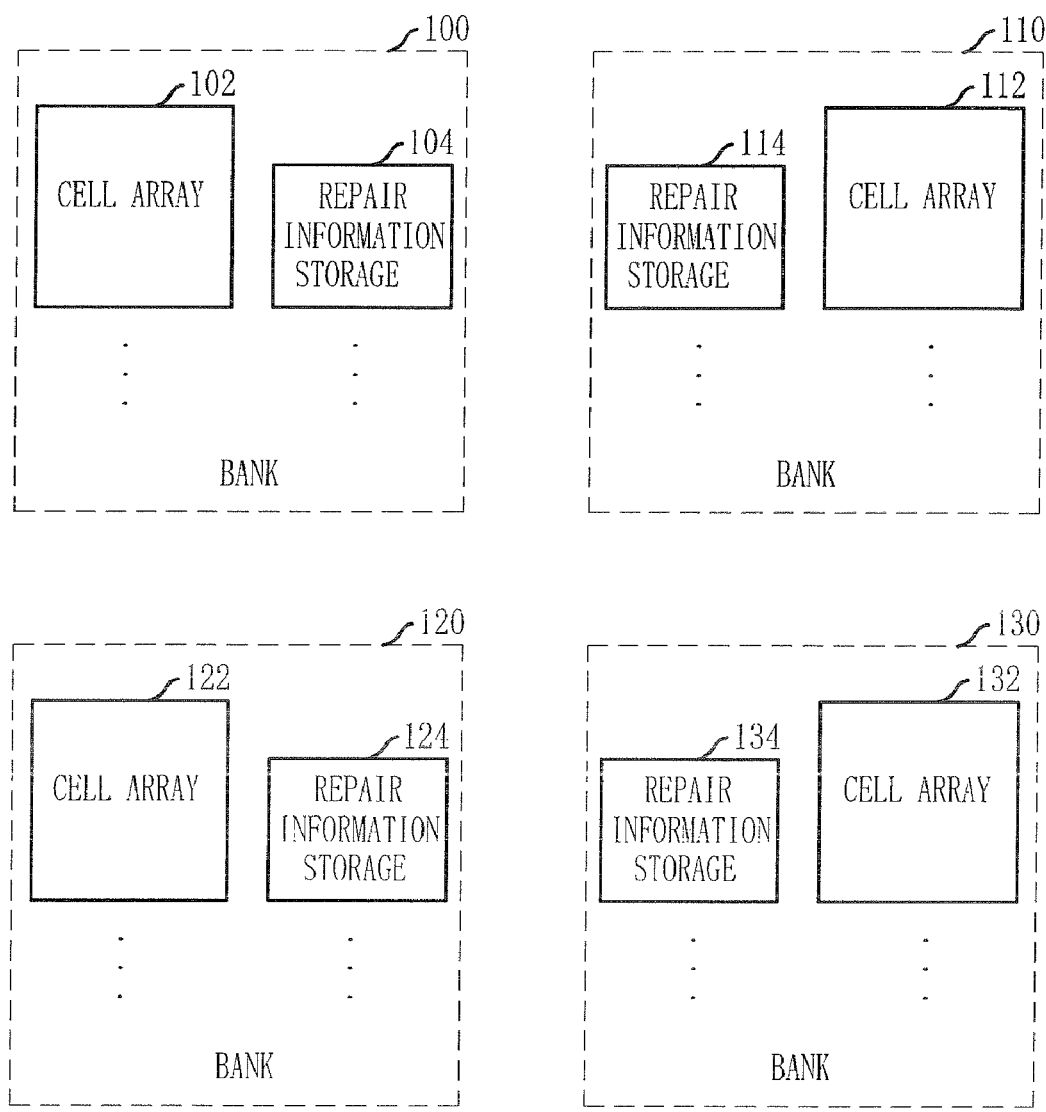
FIG. 1 is a block diagram of a conventional semiconductor memory device.
Figure 2:
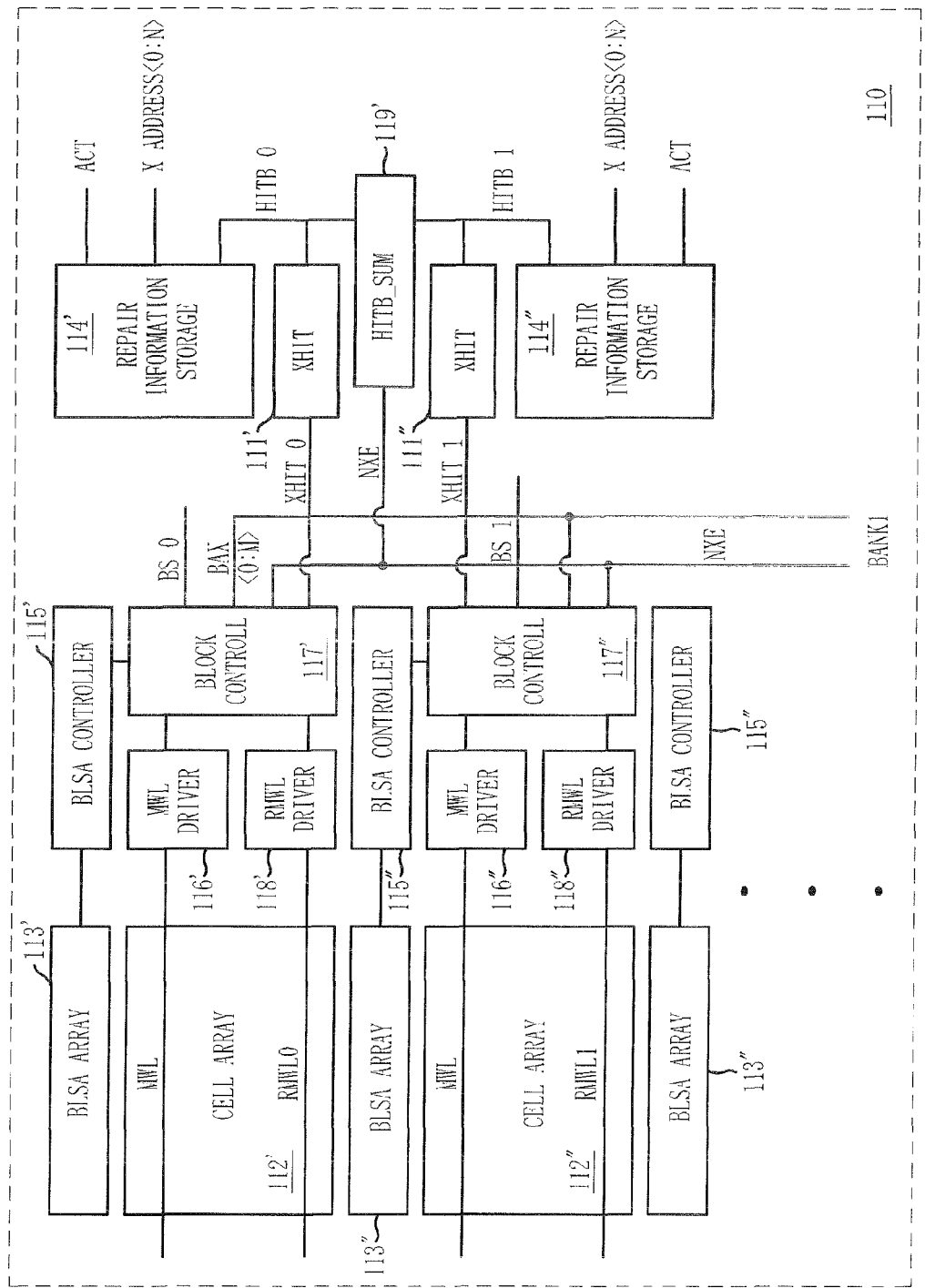
FIG. 2 is a block diagram of a bank illustrated in FIG. 1.
Figure 3:
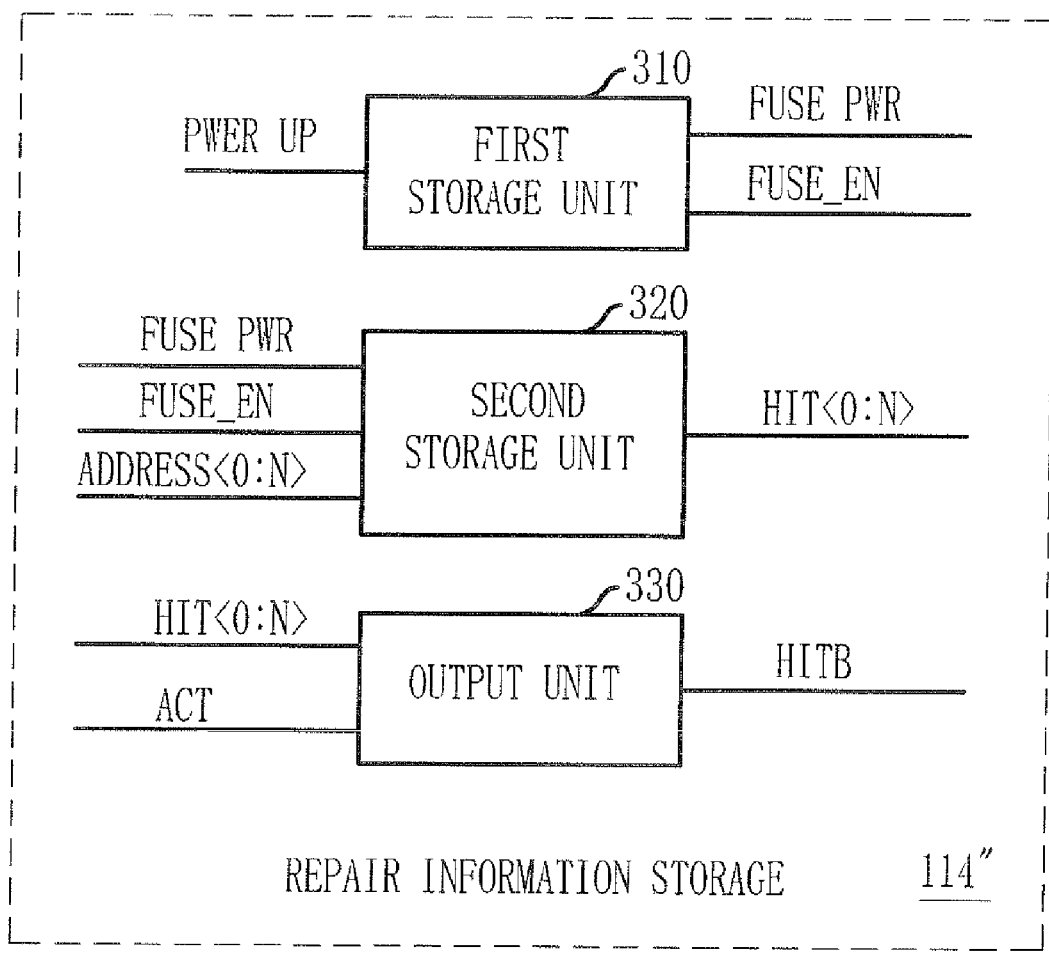
FIG. 3 is a block diagram of the repair information storage illustrated in FIGS. 1 and 2.
Figure 4:
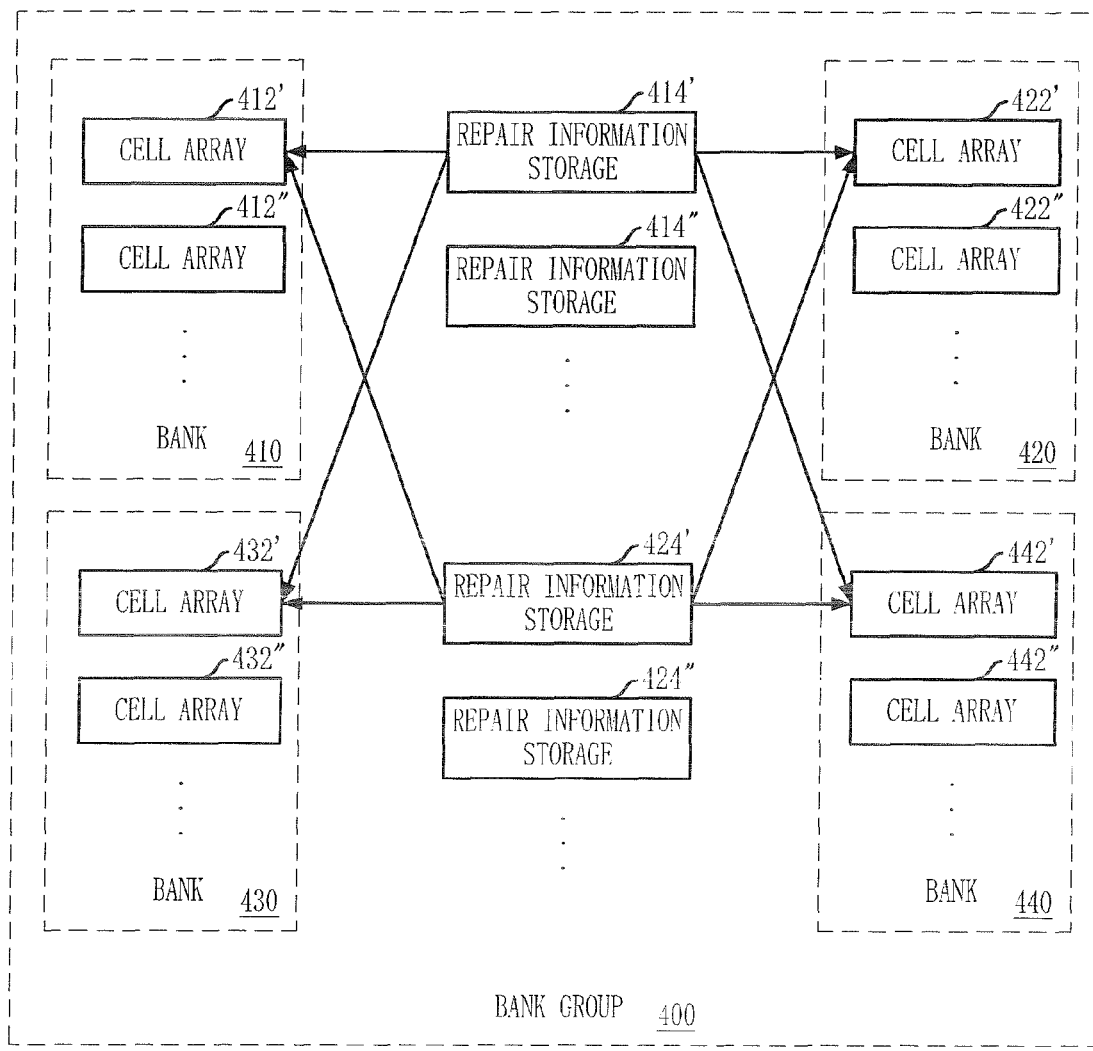
FIG. 4 is a block diagram of a semiconductor memory device in accordance with an embodiment of the invention.

FIG. 4 is a block diagram of a semiconductor memory device in accordance with an embodiment of the invention.

Referring to FIG. 4, the semiconductor memory device includes a plurality of memory banks each having a plurality of cell arrays. Each of the cell arrays includes a plurality of word lines, one or more repair word lines, and a plurality of repair information storages. The repair information storages store bank information and row addresses for word lines to be replaced with the repair word lines.

According to the related art, the repair information storages are provided in each cell array, and one repair information storage manages the row repair with respect to one cell array. However, in accordance with the embodiment of the invention, the repair information storage is not provided in 1:1 correspondence, but manages several cell arrays. To manage the repair means to store information on the word lines to be repaired.

The repair information storage unit is shared by two or more banks. In FIG. 4, the repair information storage is shared by four banks: 410, 420, 430 and 440. The repair information storage 414' is connected to cell array 412', cell array 422', cell array 432' and cell array 442' of the banks 410, 420, 430 and 440 respectively, and stores repair information of the four cell arrays. The repair information storage stores information associated with the banks as well as row addresses of the word lines to be repaired.

Further, several repair information storages, not one repair information storage, selectively manage the repair of the word lines belonging to one cell array. For example, the repair of the cell array 412' may be managed by the repair information storage 414' or the repair information storage 424'. This is because the plurality of banks or cell arrays share the repair information storage and the repair information storage stores the information associated with the banks as well as the row addresses, unlike the related art.

In FIG. 4, one repair information storage manages the repair of one cell array in each bank. For example, repair information storage 414' manages the repair of the uppermost cell array in each bank, i.e. cell array 412' in bank 410, cell array 422' in bank 420, cell array 432' in bank 430 and cell array 442' in bank 440, and the repair information storage 414" manages the repair of the second uppermost cell array in each bank, i.e. respectively cell arrays 412", 422", 432" and 442". Similarly, repair information storage unit 424' and repair information storage unit 424" also manage repair of the uppermost cell array and the second uppermost cell array respectively in each bank. The repair information storage can manage the repair of the cell arrays of the different banks, without being limited to one cell array. The semiconductor memory device of FIG. 4 can be designed in various ways.

Two access control schemes may be used in the semiconductor memory device. In the first scheme, access to the memory cell is controlled by using word lines, and in the second scheme access to the memory cell is controlled by using main word lines and sub word lines. Although the terms word line or the repair word line have been simply used herein, they can also include main word lines or repair main word lines, and sub word lines or repair sub word lines.

The semiconductor memory device in accordance with an embodiment of the invention includes a plurality of banks and a plurality of repair fuse circuits (repair information storages). Each of the banks includes a plurality of unit memory blocks e.g., cell arrays each having a plurality of word lines and repair word lines. The repair fuse circuits store bank information and row addresses of the word lines to be repaired. When the semiconductor memory device accesses the main word lines to be repaired, the repair fuse circuits shared by several banks make the semiconductor memory device access the repair word lines, thus reducing the area of the semiconductor memory device.

The semiconductor memory device can be modified according to various schemes. For example, drivers and blocks can be controlled in various schemes.

Figure 5:
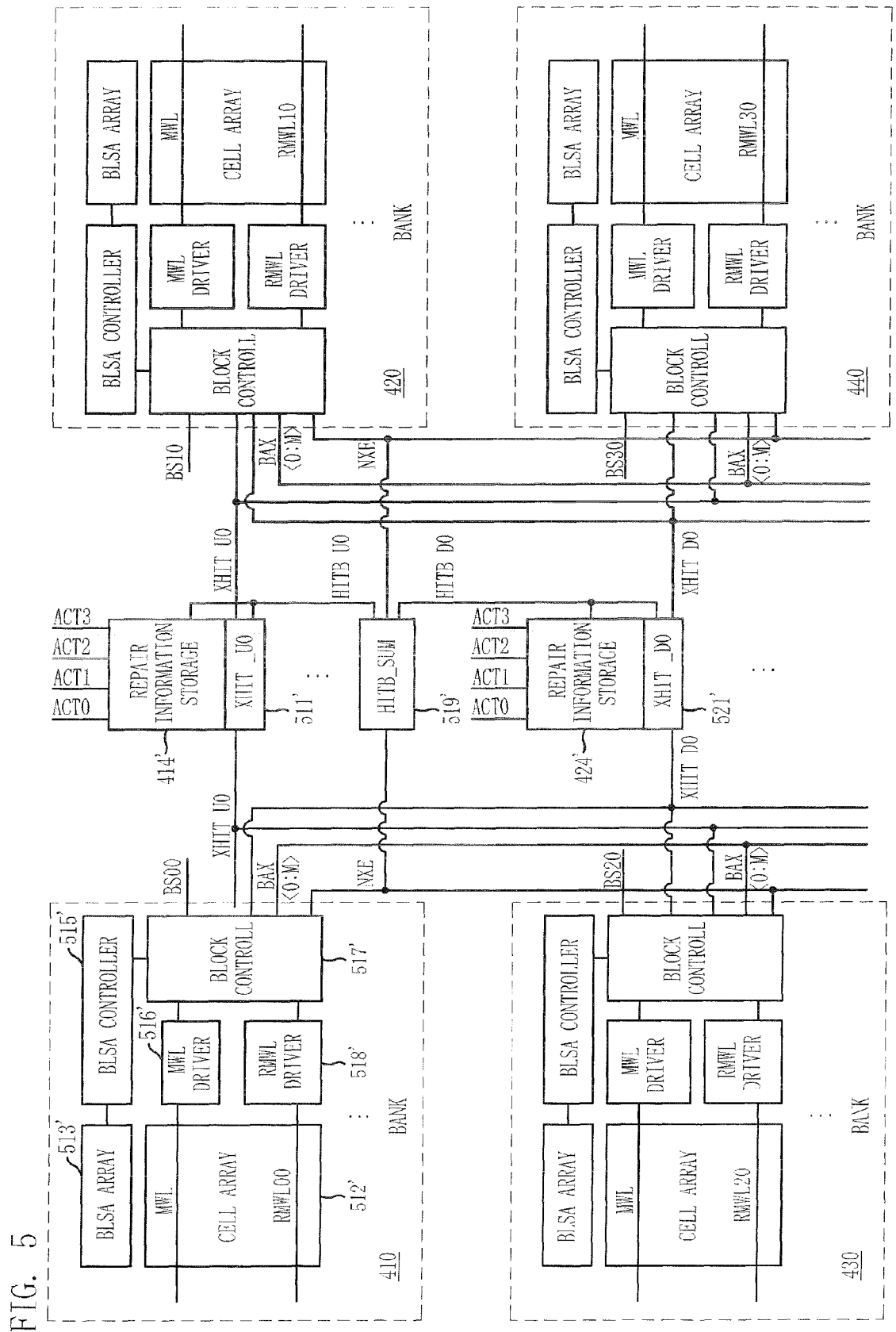
FIG. 5 is a detailed block diagram of the semiconductor memory device illustrated in FIG. 4.

FIG. 5 is a detailed block diagram of the semiconductor memory device illustrated in FIG. 4.

Referring to FIG. 5, each bank includes a plurality of cell arrays, a plurality of bit line sense amplifiers, and a plurality of row control blocks and drivers for controlling them. Bank 410 as an example, includes a plurality of cell arrays 512', etc., and a plurality of bit line sense amplifier arrays 513', etc. and bit line sense amplifier controllers 515', etc. Each of the cell arrays 512', etc. includes a main word line MWL and a repair main word line RMWL, connected to an MWL driver 516', etc. and an RMWL driver 518', etc., which are driven by a block control block 517', etc. When a signal BAX<0:M> containing active information and X-address information and a signal BS00 containing block selection information are applied to the block control block 517', etc., the main word line MWL or the repair main word line RMWL are driven according to determination information XHIT U0, XHIT D0 and NXE outputted from repair information storage 414', 424', etc. via XHIT blocks 511', 521', etc. and HITB_SUM blocks 519', etc. Banks 420, 430 and 440 are similarly constructed and operate in a similar way. Unlike the conventional semiconductor memory device, the cell arrays of the banks share the repair information storage.

Different signals ACT0, ACT1, ACT2 and ACT3 are inputted to the repair information storage, as will be described below.

Figure 6:
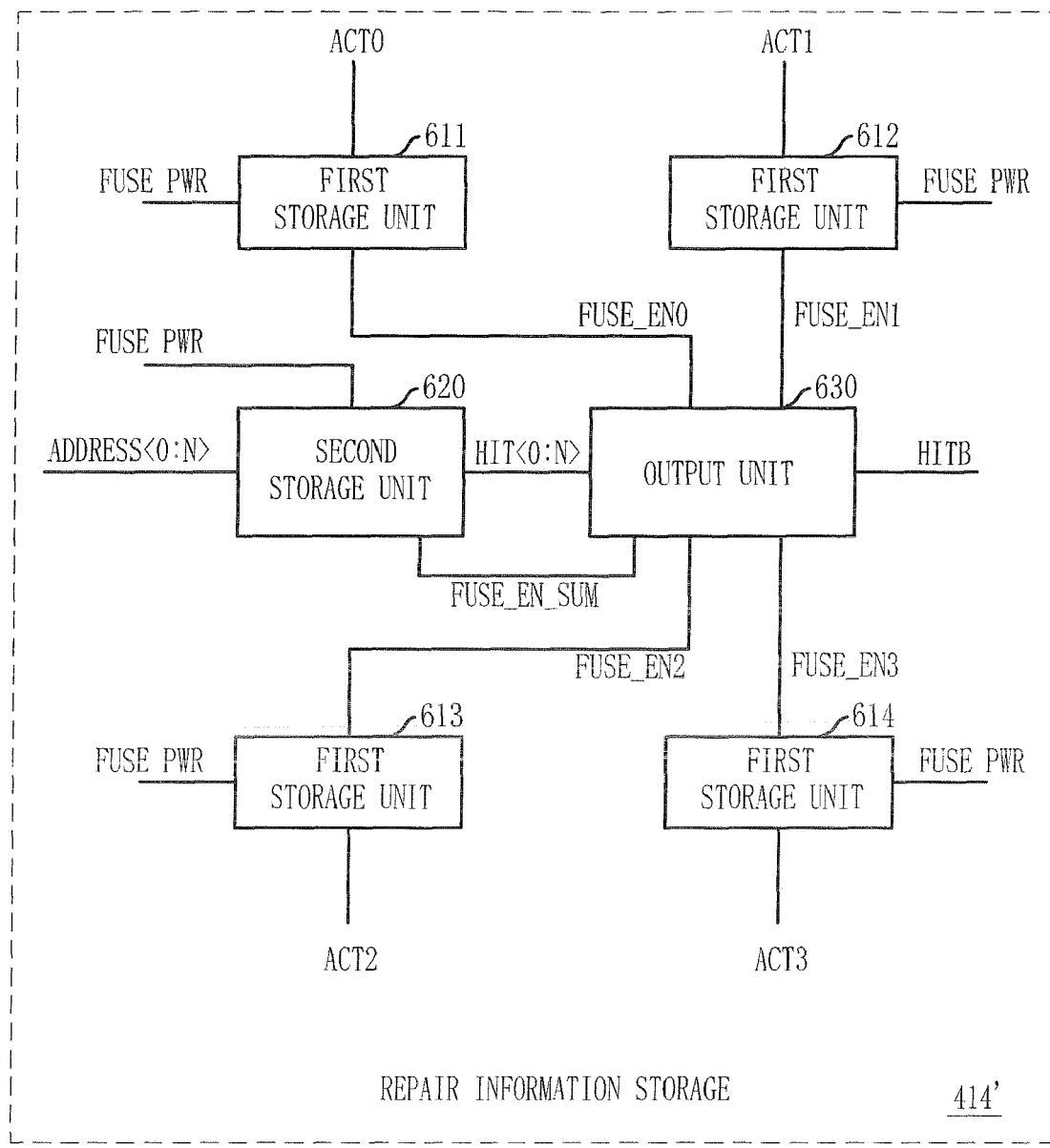
FIG. 6 is a block diagram of a repair information storage illustrated in FIG. 4.

FIG. 6 is a block diagram of the repair information storage illustrated in FIG. 4.

Referring to FIG. 6, an exemplary repair information storage 414' includes first storage units 611, 612, 613 and 614 storing information on a bank to which the word line to be repaired belongs, a second storage unit 620 storing row address of the word line to be repaired, and an output unit 630 enabled by the first storage units 611, 612, 613 and 614 to generate the signal HITB (e.g. HITB U0 or HITB D0 in FIG. 5) to enable the repair word line when the row address ADDRESS<0:N> to be accessed is identical to the row address stored in the second storage 620.

The first storage units 611, 612, 613 and 614 and the second storage unit 620 may include a plurality of fuses for storing repair information.

The first storage units 611, 612, 613 and 614 store information about which bank the word lines to be repaired belongs to. For example, the fuse of the first storage unit 611 is cut when repairing the word line belonging to the bank 410, and the fuse of the first storage unit 613 is cut when repairing the word line belonging to the bank 430. The signals ACT0, ACT1, ACT2 and ACT3 inputted to the first storage units 611, 612, 613 and 614 are pulse signals with bank active information.

The second storage unit 620 stores the row address of the word line to be repaired. The output unit 630 outputs the signal HITB for allowing the semiconductor memory device to access the repair word line, instead of the original word line, when the row address ADDRESS<0:N> to be accessed is identical to the row address stored in the second storage unit 620.

When the fuses of the first storage units 611, 612, 613 and 614 are cut and the signals ACT0, ACT1, ACT2 and ACT3 are activated, the first storage units 611, 612, 613 and 614 output signals FUSE_EN0, FUSE_EN1, FUSE_EN2 and FUSE_EN3 for enabling the output unit 630. When the row address stored in the second storage unit 620 is identical to the row address ADDRESS<0:N> to be accessed, the second storage unit 620 outputs the enable signals FUSE_EN_SUM and HIT<0:N> to the output unit 630. The output unit 630 outputs the signal HITB to allow the semiconductor memory device to use the repair word line, instead of the original word line.

The signals ACT0, ACT1, ACT2 and ACT3 are pulse signals with bank active information, and the signals FUSE_EN0, FUSE_EN1, FUSE_EN2 and FUSE_EN3 activated by the signals ACT0, ACT1, ACT2 and ACT3 are also pulse signals. The banks are not enabled at the same time and ensure a margin tRRD with a predetermined duration. Therefore, since the signals FUSE_EN0, FUSE_EN1, FUSE_EN2 and FUSE_EN3 do not interfere with one another, there is no problem in transferring the repair information.

The signal HITB outputted from the repair information storage is transferred to the XHIT block and the HITB_SUM block of FIG. 5. The XHIT block simultaneously transfers the signal XHIT to the block control block of all banks sharing the repair information storage. Note that in the figure, signals HITB and XHIT have suffixes to denote different repair information storages and XHIT blocks from which they are outputted. The signal XNE generated from the HITB_SUM block is transferred to the shared block control blocks of all banks. However, the main word lines are not replaced with the repair word lines in all banks, but the repair is carried out in only the banks stored in the first storage units 611, 612, 613 and 614. This means that the signals XHIT and NXE are shared by a plurality of banks. The sharing is possible because the signals XHIT and XNE are pulse signals with active information, and the activation in the actual bank occurs only when the block selection signal BS is activated.

When the fuse of the first storage units 611, 612, 613 and 614 is cut, the output unit 630 outputs the same signal HITB regardless of the bank corresponding to each fuse. However, in each case, the signal HITB is outputted at different timing according to an enabling timing of the signals ACT0, ACT1, ACT2 and ACT3. The repair is individually carried out in each bank because the activation in the actual banks occurs when the block selection signal BS is activated. Again note that The repair information storage stores only one row address. Hence, when the fuse managing the repair of the bank is cut, it cannot manage the repair of another bank. However, when the defects occur in the same word lines corresponding to the same row addresses in the other bank, the repair of two banks can be managed simultaneously.

A case where the defective word line of the cell array 512' in FIG. 5 is replaced with the repair word line RMWL00 will be described below in detail. Since the defect occurs in the bank 410, the fuse of the first storage unit 611 is cut and the second storage unit 620 is cut according to the corresponding row address. When the semiconductor memory device accesses the bank 410, the signal ACT0 is activated so that the first storage unit 611 outputs the signal FUSE_EN0. In addition, when the row address ADDRESS<0:N> is identical to the row address fuse cutting information stored in the second storage unit 620, the second storage unit 620 activates the signals HIT<0:N> and FUSE_EN_SUM. The output unit 630 activates the signal HITB (HITB U0 in FIG. 5) to a low level. The signal HITB U0 is inputted to the XHIT_U0 block and the HITB_SUM block. The signals XHIT U0 and NXE are also activated. The signal XNE is transferred to all block control blocks connected thereto, thereby preventing the word lines from being driven. The signal XHIT U0 drives the repair word line. However, since the bank selected by the block selection signal BS00 is bank 410, only the repair word line RMWL00 is driven, but the repair word lines RMWL10, RMWL20 and RMWL30 are not driven.

As described above, the repair information storages are shared by different banks. Thus, a total number of the repair information storages can be reduced. This is advantageous to reducing an entire area of the semiconductor memory device, while a total number of repairable word lines are also reduced because the number of the repair information storages is reduced. As illustrated in FIG. 4, when four cell arrays in four banks are configured to share two repair information storages, two cell arrays in the four banks can be repaired. The above-described disadvantage can be overcome.

Further, since the repair information storages are shared, the circuits for preventing the driving of the main word line using the signal XNE when the signals HITB and XHIT for enabling the repair word line is activated can be shared by two or more banks. Therefore, the area of the semiconductor memory device can be further reduced.

In accordance with the specific embodiments of the invention, a total number of the repair information storages for row repair can be reduced and thus an entire circuit area of the semiconductor memory device can be significantly reduced.

While the invention has been described with respect to the specific embodiments, it will be apparent to those skilled in the art that various changes and modifications may be made without departing from the spirit and scope of the invention as defined in the following claims.

What is claimed is:
1. A semiconductor memory device, comprising:
a plurality of memory banks;
a plurality of cell arrays arranged in each of the memory banks;
a plurality of array word lines arranged in each of the cell arrays;
one or more repair word lines arranged in each of the cell arrays; and
a plurality of repair information storages configured to store bank information and row addresses of array word lines to be replaced with the repair word lines, wherein each of the repair information storages is configured to store statuses relating to different ones of the memory banks, respectively, and includes:
- a plurality of first storage units corresponding to the memory banks and configured to output a plurality of enable signals in response to bank active signals;
- a second storage unit configured to store a row address of an array word line to be repaired; and
- an output unit enabled in response to the enable signals and configured to output a signal to enable a repair word line when a row address of an array word line to be accessed is identical to the row address stored in the second storage unit.

2. The semiconductor memory device as recited in claim 1, wherein each of the repair information storages is shared by two or more of the memory banks.

3. The semiconductor memory device as recited in claim 1, wherein the repair information storage stores repair information of an array word line belonging to a cell array.

4. The semiconductor memory device as recited in claim 1, wherein the repair information storages includes a plurality of fuses configured to store locations of array word lines to be repaired.

5. The semiconductor memory device as recited in claim 1, wherein the repair information storages allow the semiconductor memory device to access a repair word line instead of the array word line to be repaired.

6. The semiconductor memory device as recited in claim 1, wherein the first storage unit and the second storage unit include a plurality of fuses configured to store information as to array word lines to be repaired.

7. The semiconductor memory device as recited in claim 1, further comprising a driver circuit configured to drive an array word line or a repair word line according to the bank information.

8. The semiconductor memory device as recited in claim 1, wherein each of the cell arrays allows two or more of the repair information storages to selectively manage a repair of an array word line.

9. The semiconductor memory device as recited in claim 1, further including a circuit configured to prevent a driving of the array word line to be accessed when a signal to enable a repair word line is activated, wherein the circuit is shared by two or more of the repair information storages.

* * * * *